United States Patent
Fan et al.

(10) Patent No.: US 9,614,307 B2
(45) Date of Patent: Apr. 4, 2017

(54) ANTI-DATA THEFT STRUCTURES AND ELECTRONIC DEVICES WITH THE SAME

(71) Applicant: HON HAI PRECISION INDUSTRY CO., LTD., New Taipei (TW)

(72) Inventors: Chih-Hsiang Fan, New Taipei (TW); Ying-Jui Huang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/830,729

(22) Filed: Aug. 19, 2015

(65) Prior Publication Data

US 2016/0066444 A1    Mar. 3, 2016

(30) Foreign Application Priority Data

Aug. 26, 2014 (TW) .............................. 103129366 A

(51) Int. Cl.
| | |
|---|---|
| H01R 12/00 | (2006.01) |
| H01R 12/70 | (2011.01) |
| H05K 5/02 | (2006.01) |
| H01R 13/24 | (2006.01) |
| H01R 12/71 | (2011.01) |
| H01R 31/08 | (2006.01) |

(52) U.S. Cl.
CPC ..... *H01R 12/7076* (2013.01); *H01R 13/2421* (2013.01); *H05K 5/0208* (2013.01); *H01R 12/714* (2013.01); *H01R 13/2478* (2013.01); *H01R 31/08* (2013.01)

(58) Field of Classification Search
CPC  H01R 12/7076; H01R 31/2421; H01R 31/08; H01R 12/714; H01R 13/2478; H01H 3/14

USPC ........................................... 439/78, 955, 140
See application file for complete search history.

(56) References Cited

U.S. PATENT DOCUMENTS 6,200,158 B1 * 3/2001  Robinson ........... H01R 13/6397
                                                              439/146
6,758,690 B1 * 7/2004  Yu ...................... H01R 13/6485
                                                              439/140

(Continued)

FOREIGN PATENT DOCUMENTS

CN          2651962 Y      10/2004
CN       202011326 U    *  10/2011

*Primary Examiner* — Abdullah Riyami
*Assistant Examiner* — Nader Alhawamdeh
(74) *Attorney, Agent, or Firm* — Zhigang Ma

(57) ABSTRACT

A connector in an electronic device includes a case, a supporting element, and an elastic element. The case defines a through hole and a plurality of latching portions protruding from an inner surface of the case surrounding the through hole. The latching portions include an engaging surface and a guiding surface adjacent to the engaging surface. The supporting element is partially received in the through hole. The supporting element includes terminal recesses and resisting pieces engaging with the engaging surface. The elastic element is partially received in the supporting element and supplied a resilient force. When the supporting element is moved away from the case, the resisting piece is separated from the engaging surface to make contact with the guiding surface under the resilient force. If reassembly of the connector contacts is not in the predetermined order the electronic device will be locked down.

19 Claims, 11 Drawing Sheets

(56) References Cited

U.S. PATENT DOCUMENTS

| | | | | |
|---|---|---|---|---|
| 7,866,992 B2* | 1/2011 | Pfeiffer | ................ | H01R 13/443 |
| | | | | 439/140 |
| 2015/0318628 A1* | 11/2015 | Lee | ................... | H01R 12/7076 |
| | | | | 439/78 |

* cited by examiner

ANTI-DATA THEFT STRUCTURES AND ELECTRONIC DEVICES WITH THE SAME

FIELD

The subject matter herein generally relates to electronic device security.

BACKGROUND

Systems of an electronic device store personal and technical information. Disassembly of the electronic device can be done by anyone allowing unauthorized people to be able to falsify the system and even steal the information.

BRIEF DESCRIPTION OF THE DRAWINGS

Implementations of the present technology will now be described, by way of example only, with reference to the attached figures, wherein.

DETAILED DESCRIPTION

Figure 1:
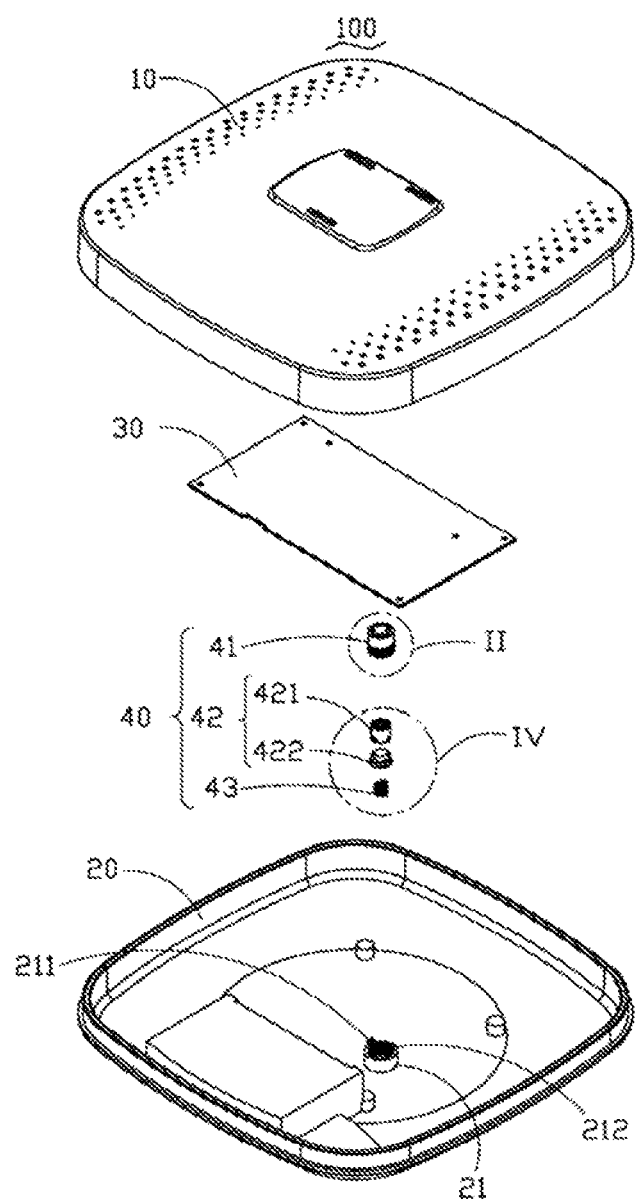
FIG. 1 is an exploded view of an electronic device with anti-data theft structure, including a connector.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to anti-data theft structures and electronic device with the same.

FIG. 1 illustrates an electronic device 100 includes a first cover 10, a second cover 20 opposite to the first cover 10, a printed circuit board 30, and a connector 40. The electronic device 100 is configured to prevent unauthorized people from resetting the system of the electronic device 100 after the electronic device 100 has been disassembled. The first cover 10 is detachably coupled to the second cover 20 and cooperates with the second cover 20 to define a receiving chamber. The printed circuit board 30 and the connector 40 are received in the receiving chamber. The printed circuit board 30 is coupled to the first cover 10, and the connector 40 is coupled to the second cover 20. When the first cover 10 is latched with the second cover 20, the printed circuit board 30 resists the connector 40 and is electrically coupled to the connector 40.

The second cover 20 includes a base 21. The base 21 is a pillar and defines a positioning hole 211. The connector 40 is inserted into the positioning hole 211 to be coupled to the base 21. In the embodiment, the positioning hole 211 is a hollow-cylindrical shape extending from one end of the base 21. An inner surface of the base 21 surrounding the positioning hole 211 forms a first matching element 212. In the embodiment, the first matching element 212 is an internal thread. In other embodiments, the first matching element 212 can be a latch or a hook.

The connector 40 includes a case 41, a supporting element 42, and an elastic element 43. The case 41 is partially received in the positioning hole 211 and coupled to the base 21. The base 41 defines a through hole 411 (see FIG. 2). The supporting element 42 is slidable and received in the through hole 411 and one end of the supporting element 42 extends from the through hole 411 (see FIG. 6). The elastic element 43 is located between the supporting element 42 and a bottom of the positioning hole 211. The supporting element 42 can slide in the through hole 411 under a resilient force supplied by the elastic element 43. In the embodiment, an outside surface of the case 41 forms a second matching element 412 engaging with the first matching element 212. The second matching element 412 is an external thread. In other embodiments, the second matching element 412 can be a latching piece.

Figure 2:
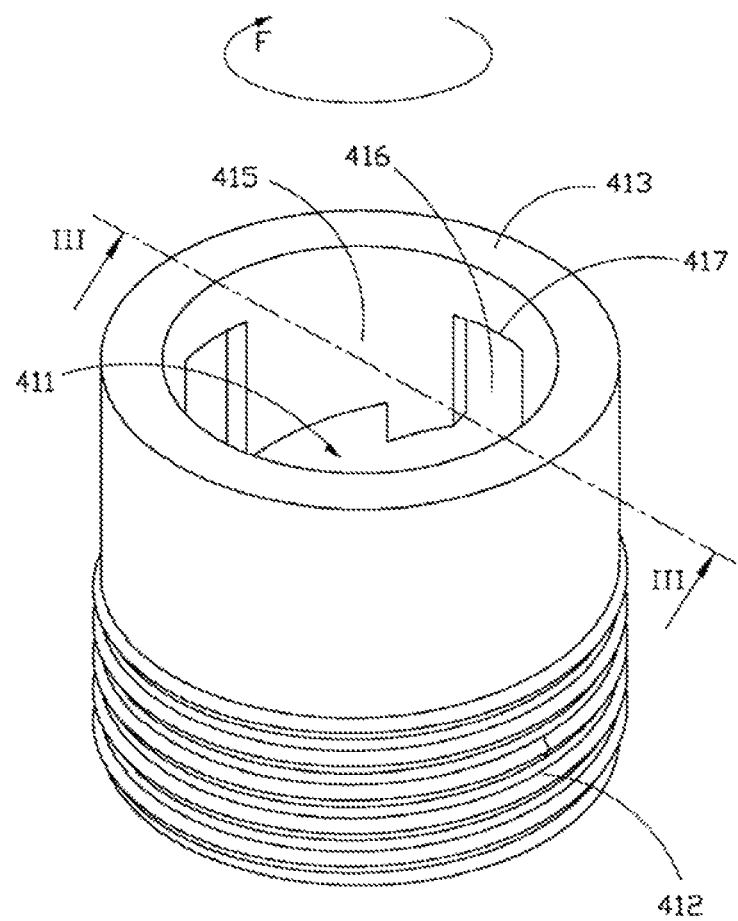
FIG. 2 is an enlarged view of circle II of FIG. 1.
Figure 3:
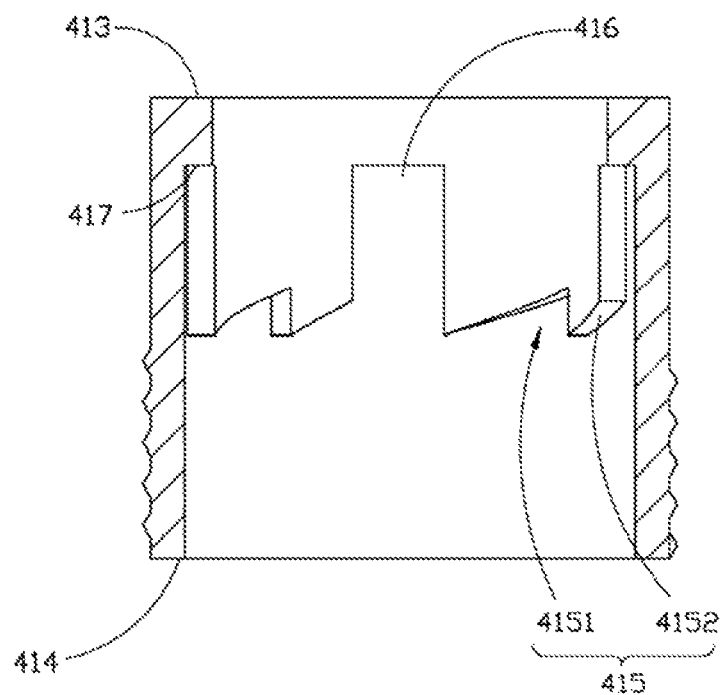
FIG. 3 is a partial cross-sectional view of taken along III-III of FIG. 2.

FIGS. 2-3 illustrate that the case 41 is a hollow-cylindrical shape, including a first surface 413 and a second surface 414 opposite to the first surface 413. The first surface 413 faces the first cover 10, and the second surface 414 faces the second cover 20. The through hole 411 extends from the first surface 413 to the second surface 414 along an axial direction of the case 41. An internal surface of the case 41 surrounding the through hole 411 forms at least one latching portion 415. Each latching portion 415 includes an engaging surface 4151 and a guiding surface 4152 adjacent to the engaging surface 4151. The engaging surface 4151 and the guiding surface 4152 face the second cover 20. The guiding surface 4152 is a first inclined surface, and the engaging surface 4151 facing the second cover 20 is a second inclined surface. In the embodiment, the guiding surface 4152 and the engaging surface 4151 are inclined along clockwise direction F away from the second cover 20. In the embodiment, the inner surface of the case 41 surrounding the through hole 411 forms four latching portions 415, the four latching portions 415 are equally spaced on the inner surface of the case 41. A slot 416 is defined between every two adjacent latching portions 415. That is, in the embodiment, the inner surface of the case 41 defines four slots 416. The slots 416 extend along an axial direction of the through hole 411. The case 41 includes two sidewalls surrounding the slot 416. One of the two sidewalls is adjacent to the engaging surface 4151, and the other one of the two sidewalls is adjacent to the guiding surface 4152. A top wall is located between the two sidewalls of the slot 416. A stopper 417 protrudes from the top wall close to the first surface 413. In other embodiments, the stopper 417 can be omitted.

Figure 4:
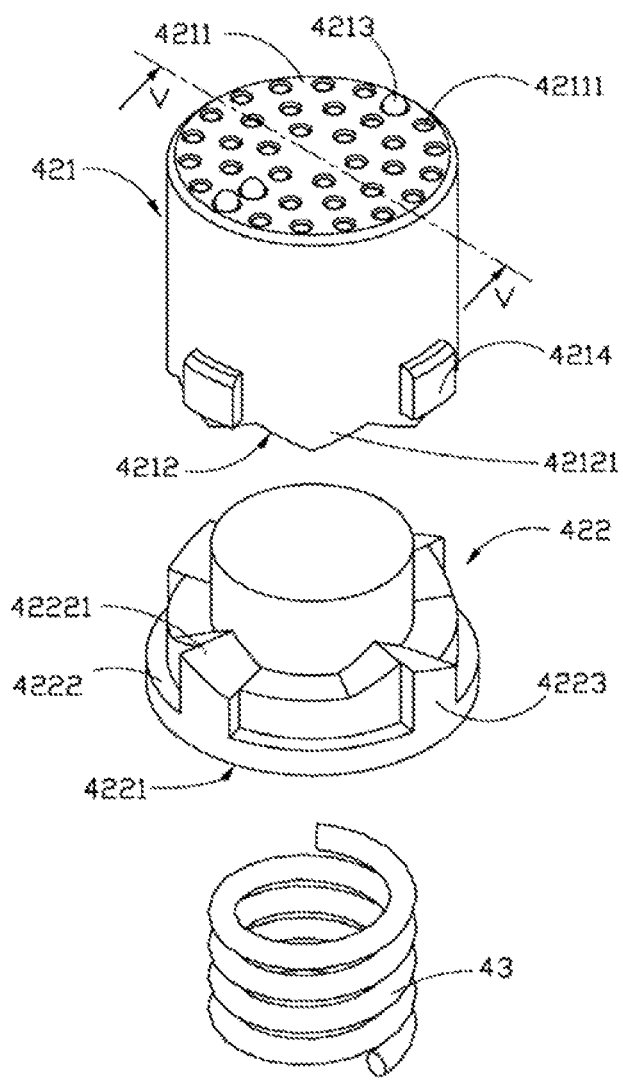
FIG. 4 is an enlarged view of circle IV of FIG. 1.
Figure 5:
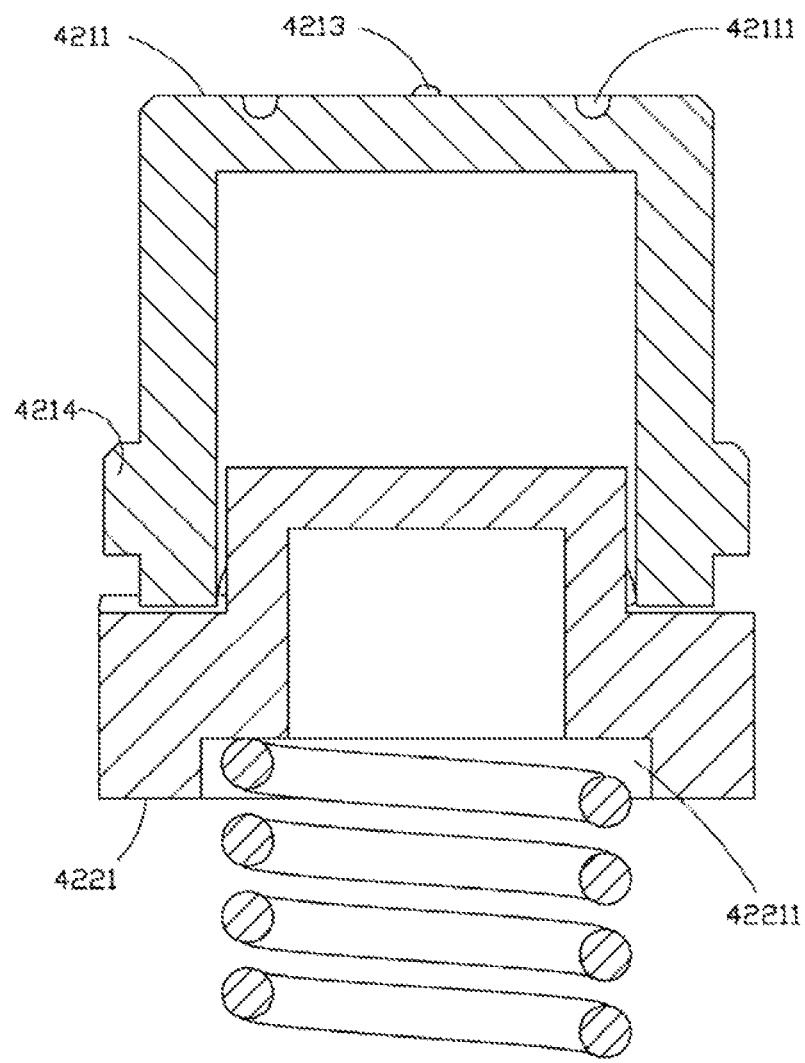
FIG. 5 is a partial cross-sectional view of taken along V-V of FIG. 4.

FIGS. 4-5 illustrate that the supporting element 42 includes a sleeve 421, and a driving element 422. The sleeve 421 is slidable and received in the through hole 411 and one end of the sleeve 421 extends from the through hole 411. The driving element 422 is slidable and received in the through hole 411 and engages with the other end of the sleeve 421 rotating the driving element 421 with respect to the sleeve 421.

The sleeve 421 is a hollow-cylindrical shape matching the through hole 411. The sleeve 421 includes a first top surface 4211 facing the first cover 10, and a first surface 4212 facing the second cover 20. The first top surface 4211 defines a plurality of terminal recesses 42111. At least one terminal 4213 is located in at least one corresponding terminal recess 42111. In the embodiment, the terminals 4213 are metallic balls. A first latching surface 42121 extends from the first surface 4212 toward the second cover 20 to form a first tooth. The first tooth circles around the first surface 4212. A plurality of blocks 4214 protrude from an external sidewall of the sleeve 421. The blocks 4214 are slidable and received in the corresponding slots 416 (see FIG. 7). The blocks 4214 engage with the slots 416 to limit sliding direction of the sleeve 421.

The driving element 422 is substantially a disc, including a second surface 4221 facing the second cover 20 and a second top surface 4222 facing the sleeve 421. The second surface 4221 defines a groove 42211 configured to partially receive the elastic element 43. The second top surface 4222 has a second latching surface 42221 configured to engage with the first latching surface 42121. The second latching surface 42221 perpendicularly extends from the second top surface 4222 toward the first latching surface 42121 to form second teeth. The second teeth circle around the second top surface 4222 to engage with the first teeth. A plurality of resisting pieces 4223 protrude from an external sidewall of the driving element 422. The resisting pieces 4223 are latched with the engaging surface 4151 to limit the driving element 422 from being slid away from the second cover (see FIG. 7). The resisting pieces 4223 engage with the guiding surface 4151 (see FIG. 10) and slide the resisting pieces 4223 into the slot 416 to release the driving element 422 from the latching portion 415 (see FIG. 8). In the embodiment, the external sidewall of the driving element 422 has four resisting pieces 4223 engaging with the corresponding four latching portions 415 or received in the corresponding four slots 416. A surface of the resisting piece 4223 is inclined enabling contact with the engaging surface 4151 or the guiding surface 4152. An incline direction of the resisting piece 4223 is the same as the incline direction of the guiding surface 4152 and the engaging surface 4151.

In the embodiment, the elastic element 43 is a spring. One end of the elastic element 43 is received in the groove 42211, and the other end is resisted with the positioning hole 211.

The printed circuit board 30 includes a plurality of signal endings (not shown). The plurality of signal endings is located on a surface of the printed circuit board 30 facing the first top surface 4211 of the sleeve 421. The signal endings are in one-to-one correspondence with the terminal recesses 42111. In the embodiment, the signal ending is a metallic pad.

Figure 6:
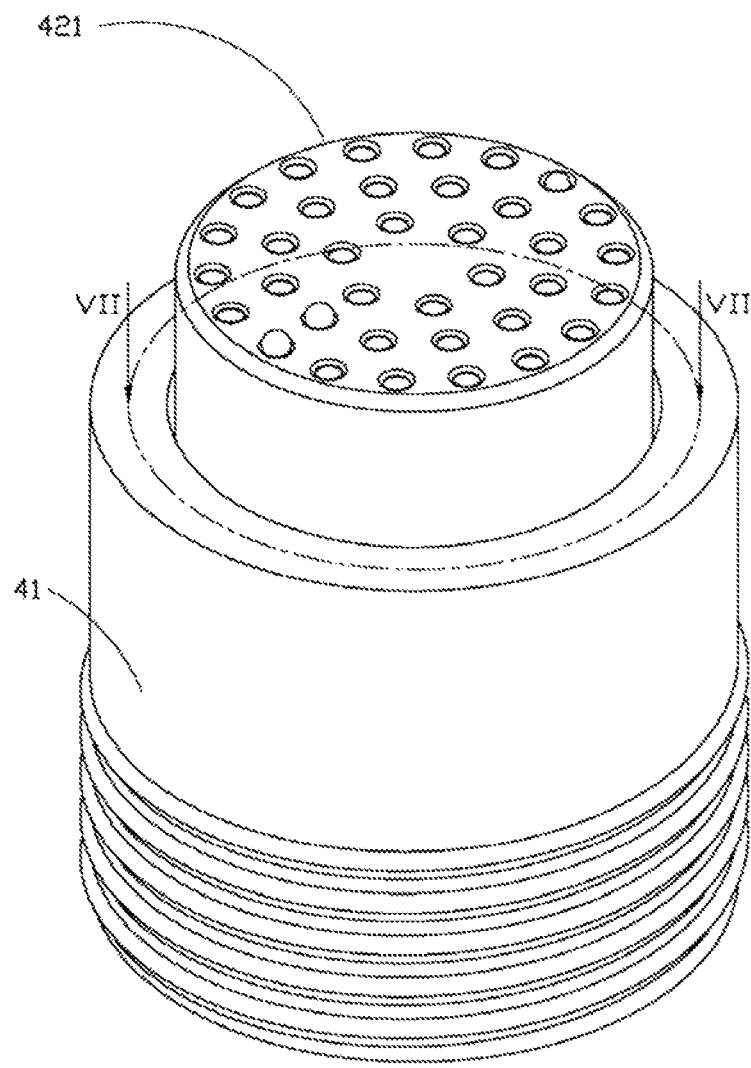
FIG. 6 is an assembly view of the connector.
Figure 7:
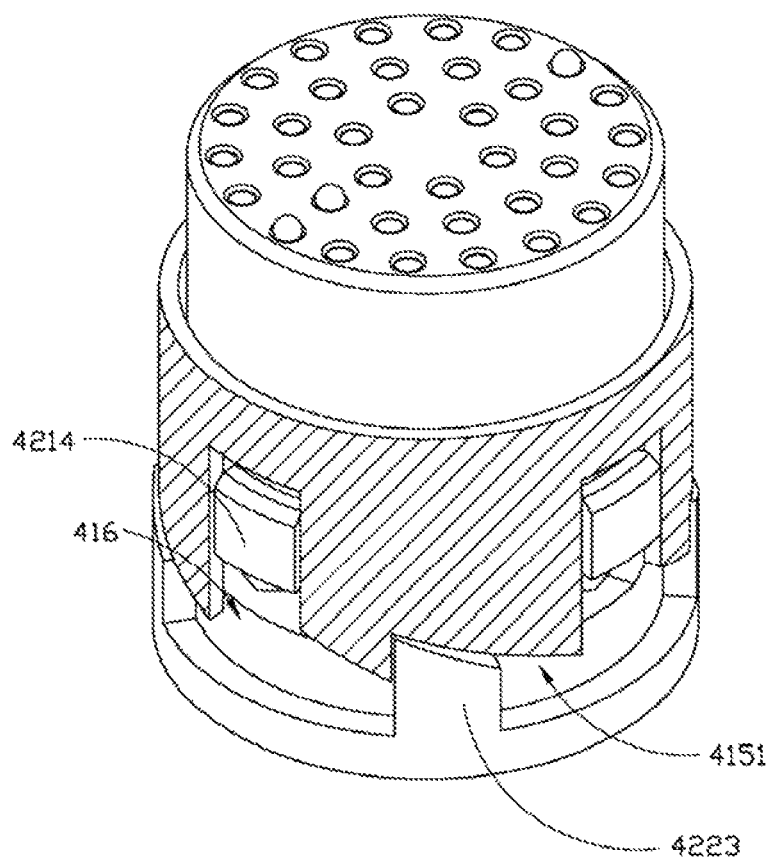
FIGS. 7-11 are partial cross-sectional views of taken along VII-VII of FIG. 6 in different using states.
Figure 9:
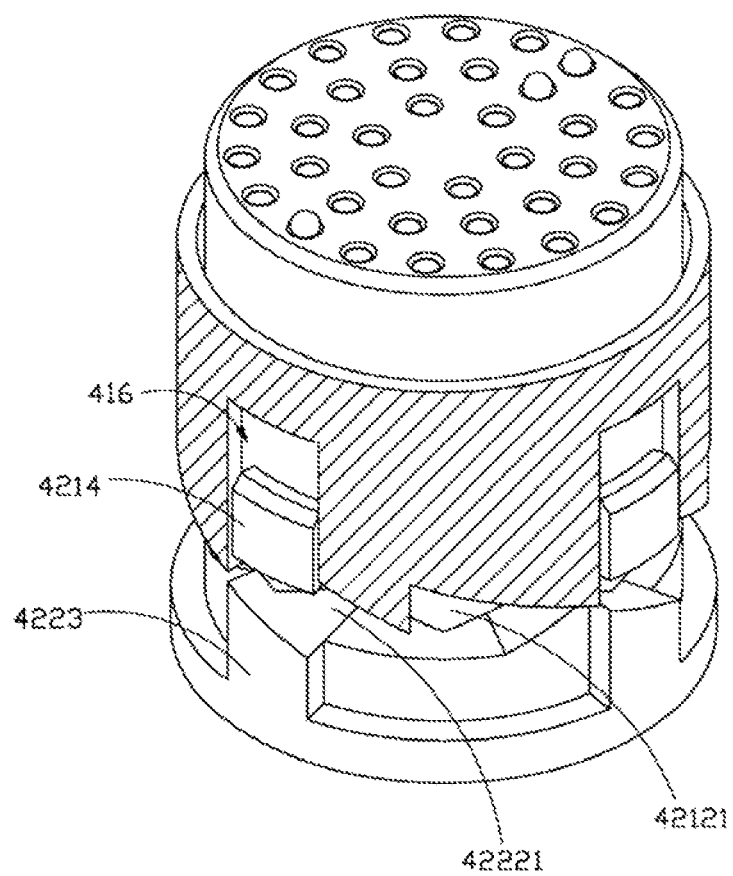

FIGS. 6-7 illustrate that in assembly, the sleeve 421 is inserted from the second surface 414 of the case 41 to the through hole 411 to receive the four blocks 4214 in the corresponding slots 416. The driving element 422 is inserted from the second surface 414 of case 41 to the through hole 411 to latch the resisting piece 4223 with the engaging surface 4151. In other embodiments, FIG. 9 illustrates that the resisting piece 4223 is received in the slot 416. One end of the elastic element 43 is inserted in the groove 42211. The case 41, the sleeve 421, the driving element 422, and the elastic element 43 are mounted on the base 21. The case 41 is coupled to the base via engagement of the first matching element 212 with the second matching element 412. When one end of the elastic element 43 is resisted by the positioning hole 212 and the other one end of which is resisted by the groove 42211 of the driving element 422, the elastic element 43 is compressed to store a resilient force.

Figure 8:
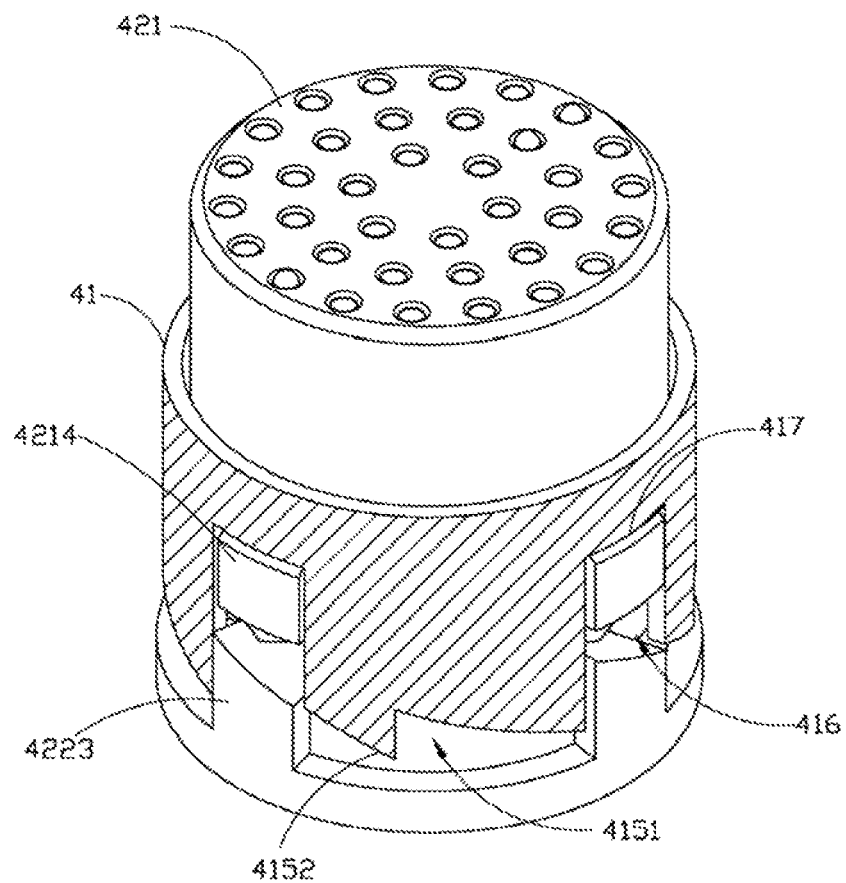
Figure 10:
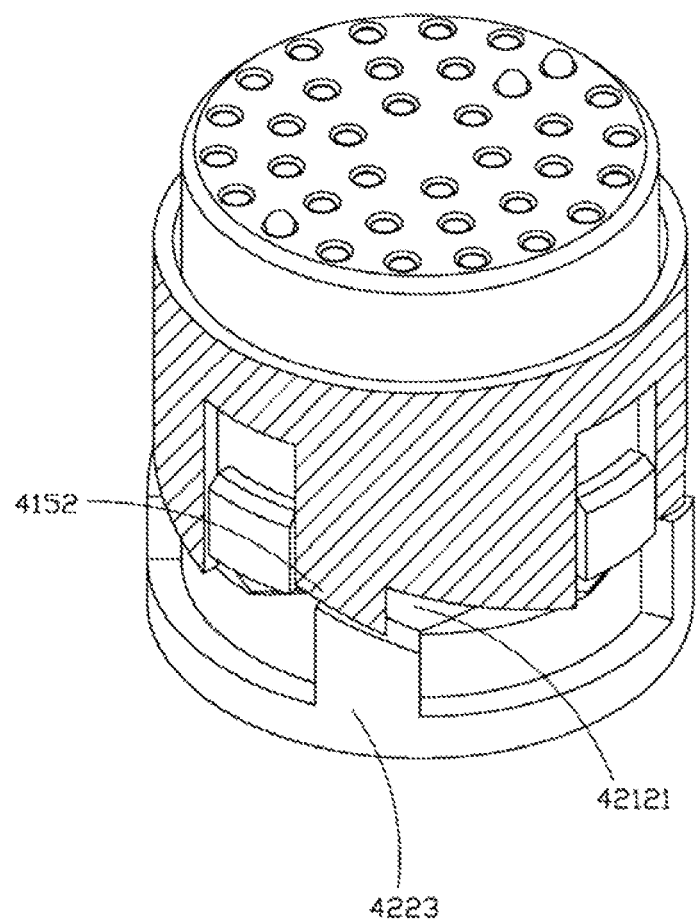

FIGS. 8-10 illustrate that in other embodiments, in assembly, the resisting piece 4223 of the driving element 422 is slidable and received in the slot 416, the sleeve 420 is pressed under an external force to push the driving element 422 to move toward the second cover 20, and the elastic element 43 is compressed to store a resilient force. When the resisting piece 4223 is detached from the slot 416, the first latching surface 42121 engages with the second latching surface 42221 to rotate the driving element 422 with respect to the sleeve 421 under the resilient force. The inclined surface of the resisting piece 4223 is contacted with the inclined surface of the engaging surface 4151. When the external force is removed, the driving element 422 slides along the guiding surface 4152 to an adjacent engaging surface 4151 under the resilient force, and the driving element 422 is restricted in the engaging surface 4151.

When the driving element 422 is restricted in the engaging surface 4151, the terminals 4213 are located in desired terminal recesses 42111 (see FIG. 4), which is in a predetermined positional relationship. When the first cover 10 is latched with the second cover 20, the printed circuit board 30 is resisted with the sleeve 421 to electrically couple the signal endings of the printed circuit board 30 to the terminals 4213. The printed circuit board 30 produces first control signals to make the electronic device 100 work. The first control signals are stored in a random access memory (not shown) of the printed circuit board 30. The coupling relationship of the terminals 4213 and the desired terminal recesses 42111 is the predetermined positional relationship, which is placed by an authorized person.

Figure 11:
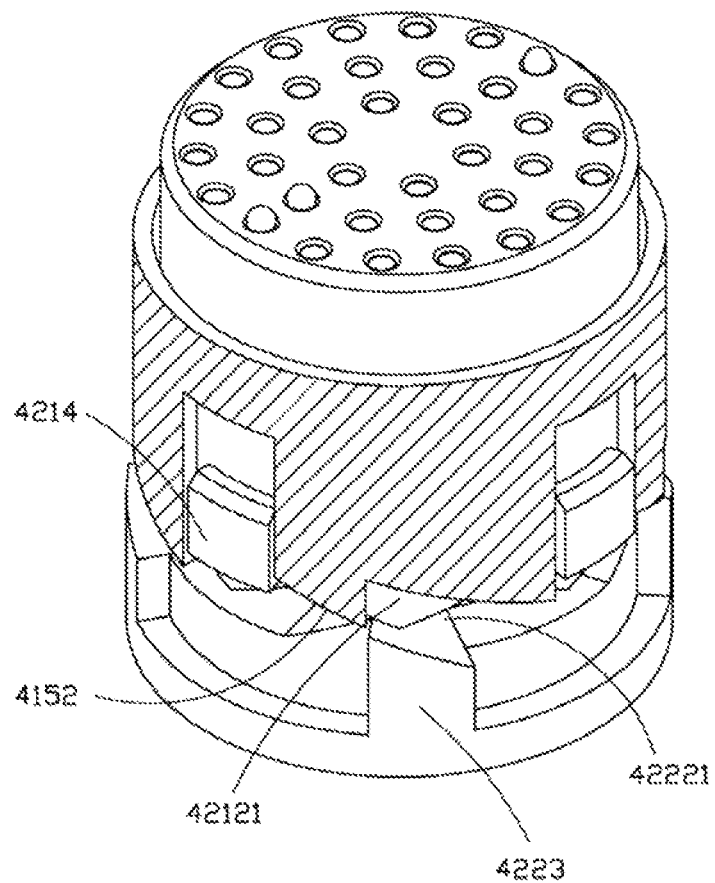

FIG. 11 illustrates that the sleeve 421 is pressed by the printed circuit board 30 to push the driving element 422 to slide toward the second cover 20. When the first cover 10 is latched with the second cover 20, the resisting piece 4223 is separated from the engaging surface 4151. The first latching surface 42121 engages with the second latching under the resilient force applied by the elastic element 43, and the driving element 422 rotates with respect to the sleeve 421 in clockwise direction. The inclined surface of the resisting piece 4223 is contacted with the inclined surface of the engaging surface 4151 (see FIG. 10).

When an unauthorized person disassembles the first cover 10 from the second cover 20, the printed circuit board 30 is detached from the sleeve 421, and the pressure made by the printed circuit board 30 is removed. FIG. 11 illustrates that the resilient force applied by the elastic element 43 pushes the sleeve 421 to slide, which causes the resisting piece 4223 to slide from the guiding surface 4152 to the slot 416. FIG. 9 illustrates that the driving element 422 drives the sleeve 421 to slide along the slot 416 and away from the second cover 20 until the blocks 4214 bump against the stopper 417. The terminals 4213 fall from the terminal recesses 42111. An unauthorized person does not know the predetermined positional relationship between the terminals 4213 and the terminal recesses 42111. Since the unauthorized person does not know the original positions of the terminals 4213, it is highly probable that the positional relationship between the terminals 4213 and the terminal recesses 42111 will be different from the original position relationship. When the unauthorized person arranges the terminals 4213 in the partial terminal recesses 42111 again, the printed circuit board 30 produces a second control signal. A processor (not shown) in the printed circuit board 30 compares the second control signals with the first control signals. When the second control signal is different from the first control signal, the processor locks down the electronic device 100 and prevents it from working, which avoids the resetting of the electronic device 10. When the second control signals are the same as the first control signals, the electronic device 10 works. Since the unauthorized person does not know the original positions of the terminals 4213, it is highly unlikely that the second control signals are the same as the first control signals, which prevents the unauthorized person from resetting the system of the electronic device 100 after reassembling the electronic device 100.

The number of terminals 4213 and the terminal slots 42111 can be increased to increase the probability of creating differences between the first and the second control signals.

The terminals 4213 are separated from terminal slots 42111 under the resilient force applied by the elastic element 43. When the unauthorized person disassembles the electronic device 100, and does not know the original position of the terminals 4213, the unauthorized person is prevented from resetting the system of the electronic device 100 after disassembling the electronic device 100.

The embodiments shown and described above are only examples. Many details are often found in the art such as the other features of an anti-data theft structure and electronic device with the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A connector, comprising:
    a case defining a through hole and a plurality of latching portions protruding from an inner surface of the case surrounding the through hole, the latching portions comprising an engaging surface and a guiding surface adjacent to the engaging surface;
    a supporting element partial received in the through hole, comprising a plurality of terminal recesses and a plurality of resisting piece engaging with the engaging surface;
    at least one terminal is located in at least one corresponding terminal recess; and
    an elastic element partial received in the supporting element and supplied a resilient force;
    wherein when the supporting element is moved away from the case, the resisting piece is separated from the engaging surface to be contacted with the guiding surface under the resilient force, and the resisting piece slides along the guiding surface under the resilient force to make the plurality of terminals to come out from the plurality of terminal recesses.

2. The connector of claim 1, wherein the guiding surface has a first inclined surface, the engaging surface has a second inclined surface, and the resisting piece has a third inclined surface to engage with the first inclined surface or the second inclined surface.

3. The connector of claim 1, wherein the supporting element comprises a sleeve and a driving element rotated with respect to the sleeve, the sleeve comprises a first latching surface, one end of the driving element comprises a second latching surface corresponding to the first latching surface, the other end of the driving element is resisted with the elastic element, when the driving element is moved via the resilient force, the first latching surface engages with the second latching surface to rotate the driving element with respect to the sleeve to make the resisting piece to be contacted with the guiding surface.

4. The connector of claim 3, wherein an inner wall of the case surrounding the through hole defines a slot, a pair of sidewalls surrounding the slot is adjacent to the engaging surface and the guiding surface, the resisting piece slides from the guiding surface into the slot under the resilient force.

5. An anti-disassembly structure, comprising:
    a printed circuit board;
    a connector electrically coupled to the printed circuit board, comprising:
        a case defining a through hole and a plurality of latching portions protruding from an inner surface of the case surrounding the through hole, the latching portions comprising an engaging surface and a guiding surface adjacent to the engaging surface;
        a supporting element partial received in the through hole, comprising a plurality of terminal recesses and a plurality of resisting piece engaging with the engaging surface; and
        an elastic element partial received in the supporting element and supplied a resilient force; and
    a plurality of terminals received in the plurality of terminal recesses and electrically coupled to the printed circuit board;
    wherein when the printed circuit board is resisted with the connector under an external force, the supporting element is moved away the case to separate the resisting piece from the latching slot and the resisting piece is contacted with the guiding surface, which compresses the elastic element to produce the resilient force; when the external force is removed, the resisting piece slides along the guiding surface under the resilient force to make the plurality of terminals to come out from the plurality of terminal recesses.

6. The anti-disassembly structure of claim 5, wherein the guiding surface has a first inclined surface, the engaging surface has a second inclined surface, and the resisting piece has a third inclined surface to engage with the first inclined surface or the second inclined surface.

7. The anti-disassembly structure of claim 5, wherein the supporting element comprises a sleeve and a driving element rotated with respect to the sleeve, the sleeve comprises a first latching surface, one end of the driving element comprises a second latching surface corresponding to the first latching surface, the other one end of the driving element is resisted with the elastic element, when the driving element is moved via the resilient force, the first latching surface engages with the second latching surface to rotate the driving element with respect to the sleeve to make the resisting piece to be contacted with the guiding surface.

8. The anti-disassembly structure of claim 7, wherein an inner wall of the case surrounding the through hole defines a slot, a pair of sidewalls surrounding the slot is adjacent to the engaging surface and the guiding surface, the resisting piece slides from the guiding surface into the slot under the resilient force.

9. The anti-disassembly structure of claim 8, wherein a plurality of blocks protrudes from an external sidewall of the sleeve, the block is received in the slot, a wall surrounding the slot protrudes a stopper, when the driving element drives the sleeve to slide, the blocks bumps against the stopper and the terminals fall from the terminal recesses.

10. The anti-disassembly structure of claim 9, wherein number of the terminals is less than number of the terminal recesses.

11. An electronic device, comprising:
a first cover;
a second cover opposite to the first cover;
a printed circuit board mounted on the first cover;
a connector electrically coupled to the printed circuit board, comprising:
  a case mounted on the second cover, the case defining a through hole and a plurality of latching portions protruding from an inner surface of the case surrounding the through hole, the latching portions comprising an engaging surface and a guiding surface adjacent to the engaging surface;
  a supporting element partial received in the through hole, comprising a plurality of terminal recesses and a plurality of resisting piece engaging with the engaging surface; and
  an elastic element partial received in the supporting element and supplied a resilient force; and
a plurality of terminals received in the plurality of terminal recesses in a predetermined position and electrically coupled to the printed circuit board;
wherein when the first cover is latched with the second cover, the printed circuit board is resisted with and electrically coupled to the connector to produce first control signals to make the electronic device work, the supporting element is moved toward the second cover to separate the resisting piece from the latching slot and the resisting piece is contacted with the guiding surface, which compresses the elastic element to produce the resilient force; when the first cover is detached from the second cover, the resisting piece slides along the guiding surface and away from the second cover to make the plurality of terminals to come out from the plurality of terminal recesses.

12. The electronic device of claim 11, wherein when the position relationship of the terminals and the terminal recesses is changed, the printed circuit board produces second control signals different from the first control signal to prevent the electronic device from working.

13. The electronic device of claim 11, wherein the guiding surface has a first inclined surface, the engaging surface has a second inclined surface, and the resisting piece has a third inclined surface to engage with the first inclined surface or the second inclined surface.

14. The electronic device of claim 11, wherein the supporting element comprises a sleeve and a driving element rotated with respect to the sleeve, the sleeve comprises a first latching surface, one end of the driving element comprises a second latching surface corresponding to the first latching surface, the other one end of the driving element is resisted with the elastic element, when the driving element is moved via the resilient force, the first latching surface engages with the second latching surface to rotate the driving element with respect to the sleeve to make the resisting piece to be contacted with the guiding surface.

15. The electronic device of claim 14, wherein an inner wall of the case surrounding the through hole defines a slot, a pair of sidewalls surrounding the slot is adjacent to the engaging surface and the guiding surface, and when the first cover is detached from the second cover, the resisting piece slides from the guiding surface into the slot under the resilient force.

16. The electronic device of claim 15, wherein a plurality of blocks protrudes from an external sidewall of the sleeve, the block is received in the slot, a wall surrounding the slot protrudes a stopper, when the driving element drives the sleeve to slide, the blocks bumps against the stopper and the terminals fall from the terminal recesses.

17. The electronic device of claim 16, wherein the first latching surface forms a first tooth circling around a bottom surface of the sleeve, and the second latching surface forms a second tooth circling around a top surface of the driving element.

18. The electronic device of claim 11, wherein number of the terminals is less than number of the terminal recesses.

19. The electronic device of claim 11, wherein the second cover comprises a base, the base defines a positioning hole, an inner surface of the base surrounding the positioning hole forms a first matching element, the case comprises a second matching element, and the case is inserted into the positioning hole to assemble with the positioning hole via an engagement of the first matching element and the second matching element.

* * * * *